United States Patent
Sim et al.

(10) Patent No.: US 7,687,403 B2
(45) Date of Patent: Mar. 30, 2010

(54) METHOD OF MANUFACTURING FLASH MEMORY DEVICE

(75) Inventors: Guee Hwang Sim, Gangleung-si (KR); Woo Yung Jung, Seoul (KR)

(73) Assignee: Hynix Semiconductor, Icheon-si (KR)

( * ) Notice: Subject to any disclaimer, the term of this patent is extended or adjusted under 35 U.S.C. 154(b) by 156 days.

(21) Appl. No.: 11/772,005

(22) Filed: Jun. 29, 2007

(65) Prior Publication Data

US 2008/0064216 A1      Mar. 13, 2008

(30) Foreign Application Priority Data

Sep. 8, 2006      (KR) ...................... 10-2006-0086821

(51) Int. Cl.
*H01L 21/311* (2006.01)
(52) U.S. Cl. ...................... 438/703; 438/239; 438/254; 438/253; 438/256
(58) Field of Classification Search ................. 438/703, 438/637, 725, 253, 239, 256
See application file for complete search history.

(56) References Cited

U.S. PATENT DOCUMENTS

| | | | | |
|---|---|---|---|---|
| 6,136,644 | A * | 10/2000 | Tseng et al. | ................ 438/253 |
| 7,429,536 | B2 * | 9/2008 | Abatchev et al. | ............ 438/725 |
| 2001/0036743 | A1 | 11/2001 | Sandhu | |
| 2004/0127019 | A1 * | 7/2004 | Konishi et al. | .............. 438/637 |
| 2005/0003671 | A1 | 1/2005 | Liu et al. | |
| 2005/0079705 | A1 * | 4/2005 | Takeuchi | .................... 438/637 |

FOREIGN PATENT DOCUMENTS

| | | |
|---|---|---|
| CN | 1122053 | 5/1996 |
| JP | 2005-116756 A | 4/2005 |
| KR | 1020000008910 A | 2/2000 |
| KR | 1020010027928 A | 4/2001 |
| KR | 1020030054308 A | 7/2003 |
| KR | 1020040000016 A | 1/2004 |

* cited by examiner

*Primary Examiner*—Matthew Smith
*Assistant Examiner*—Wilner Jean Baptiste
(74) *Attorney, Agent, or Firm*—Townsend and Townsend and Crew LLP

(57) ABSTRACT

A method of manufacturing a flash memory device includes providing a substrate having an insulating layer, a first mask layer over the insulating layer, a second mask layer over the first mask layer, a first photoresist pattern over the second mask layer, the first photoresist pattern having a first pitch. A material layer is provided over the first photoresist pattern. The material layer is etched to convert the material layer into a material layer pattern having a second pitch that is less than the first pitch. The second hard mask layer is etched using the material layer pattern to form a second hard mask layer pattern that extends along a first direction. A second photoresist pattern is etched, the second photoresist pattern defining a first region that is not exposed and a second region that is exposed, the second region extending along a second direction that is orthogonal to the first direction. The first hard mask layer is etched using the second photoresist pattern to form a first hard mask layer pattern having an angular shape.

5 Claims, 6 Drawing Sheets

METHOD OF MANUFACTURING FLASH MEMORY DEVICE

CROSS-REFERENCES TO RELATED APPLICATIONS

The present application claims priority to Korean patent application number 10-2006-86821, filed on Sep. 8, 2006, which is incorporated by reference in its entirety.

BACKGROUND OF THE INVENTION

The present invention relates to flash memory devices and, more particularly to a method of manufacturing a flash memory device in which a contact plug used to an upper line and a lower line is formed to have an angular shape (e.g., rectangular-like shape).

As the design rule of devices decreases, the following may occur in the process of forming the drain contact hole.

First, in the process of forming the drain contact hole using a rectangular mask, the drain contact hole becomes circular due to exposure properties, such as a proximity effect and aberration.

Second, the circular drain contact hole formed above can be difficult to control the roughness near the edge portion of the contact hole. Thus, the uniformity among the drain contact holes may be difficult to obtain.

Third, in the drain contact hole having a circular shape, bias control in the long axis and the short axis can be difficult.

Fourth, an etch process may not be properly performed when the drain contact hole is formed in a circular shape in sub-100 nm design due to the limit of the resolution of exposure equipment employing a source such as ArF or KrF.

BRIEF SUMMARY OF THE INVENTION

Accordingly, embodiments of the present invention relate to methods of manufacturing a flash memory device, in which a contact plug used to connect an upper line and a lower line is formed to have an angular shape (e.g., rectangular-like shape), improving the electrical characteristics of the contact plug.

In one embodiment, a method of manufacturing a flash memory device includes forming an insulating layer, first and second hard mask layers, and a first photoresist pattern over a semiconductor substrate, the first photoresist pattern having a first pitch. A silylation reagent containing silicon is coated over the first photoresist pattern. The first photoresist pattern coated with the silylation reagent is baked to change a portion of the first photoresist pattern to a material layer containing silicon. An upper region of the material layer is removed to form a material layer pattern having a second pitch that is less than the first pitch. The second hard mask layer is etched using the material layer pattern to form a second hard mask layer pattern that extends along a first direction. A second photoresist pattern is formed, the second photoresist pattern defining a first region that is not exposed and a second region that is exposed, the second region extending along a second direction that is orthogonal to the first direction and exposing at least a portion of the second hard mask layer pattern. The first hard mask layer using the second photoresist pattern is etched to form a first hard mask layer pattern having a rectangular-like shape. The insulating layer is etched using the first hard mask layer pattern to form a contact hole having a rectangular-like shape, the contact hole exposing the semiconductor substrate.

In another embodiment, a method of manufacturing a flash memory device includes providing a substrate having an insulating layer, a first mask layer over the insulating layer, a second mask layer over the first mask layer, a first photoresist pattern over the second mask layer, the first photoresist pattern having a first pitch. A material layer is provided over the first photoresist pattern. The material layer is etched to convert the material layer into a material layer pattern having a second pitch that is less than the first pitch. The second hard mask layer is etched using the material layer pattern to form a second hard mask layer pattern that extends along a first direction. A second photoresist pattern is etched, the second photoresist pattern defining a first region that is not exposed and a second region that is exposed, the second region extending along a second direction that is orthogonal to the first direction. The first hard mask layer is etched using the second photoresist pattern to form a first hard mask layer pattern having an angular shape. The insulating layer is etched using the first hard mask layer pattern to form a contact hole having an angular shape that expose material underlying the insulating layer.

In yet another embodiment, the contact hole has a rectangular-like shape. The contact hole has corners that are substantially angular. The material exposed by the contact hole is silicon material. The material layer is spacer material coated over the first photoresist pattern. The material layer is inorganic material or organic material containing silicon.

In yet another embodiment, the step of providing the material layer over the first photoresist pattern comprises coating a silylation reagent containing silicon over the first photoresist pattern; and baking the first photoresist pattern coated with the silylation reagent to change a portion of the first photoresist pattern to the material layer containing silicon.

DESCRIPTION OF SPECIFIC EMBODIMENTS

Figure 1A:
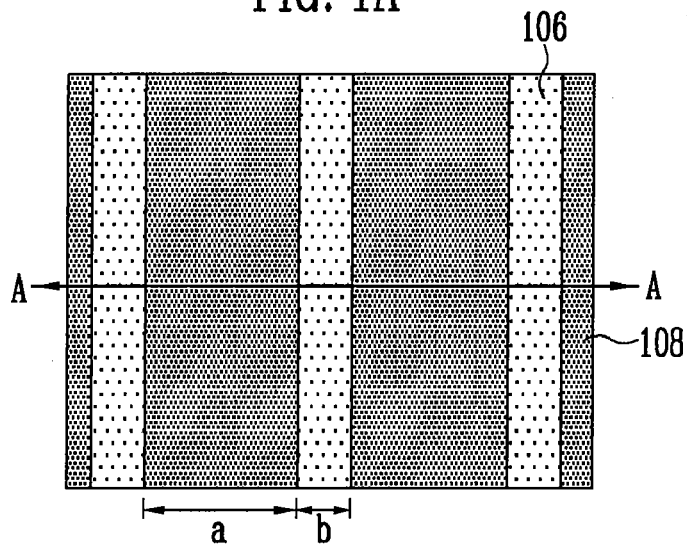
FIGS. 1A to 1C are layout diagrams illustrating a method of manufacturing a flash memory device according to an embodiment of the present invention.

A method of manufacturing a flash memory device according to an embodiment of the present invention will be described with reference to FIGS. 1A to 2G. FIG. 2A is a cross-sectional view of the device taken along line A-A in FIG. 1A. Referring to FIGS. 1A and 2A, an interlayer insulating layer 102, a first hard mask layer 104, a second hard mask layer 106 and a photoresist layer are sequentially formed over a semiconductor substrate 100 in which given structures are formed, such as an isolation layer, a gate, a spacer and an SAC nitride layer. The photoresist layer is formed from a chemical amplification type photosensitizer. The photoresist layer is changed to a first photoresist pattern 108 by selectively etching using a mask (not shown). The first photoresist pattern 108 has a pitch P. The structures of the first photoresist pattern 108 are formed to have a width a that is wider than a space b defined by the structures.

A silylation reagent containing silicon is coated on the first photoresist pattern 108. Baking is performed The silylation reagent is diffused into an outer portion of the first photoresist pattern 108. At this time, the silylation reagent is formed from $SiO_2$.

Figure 2A:
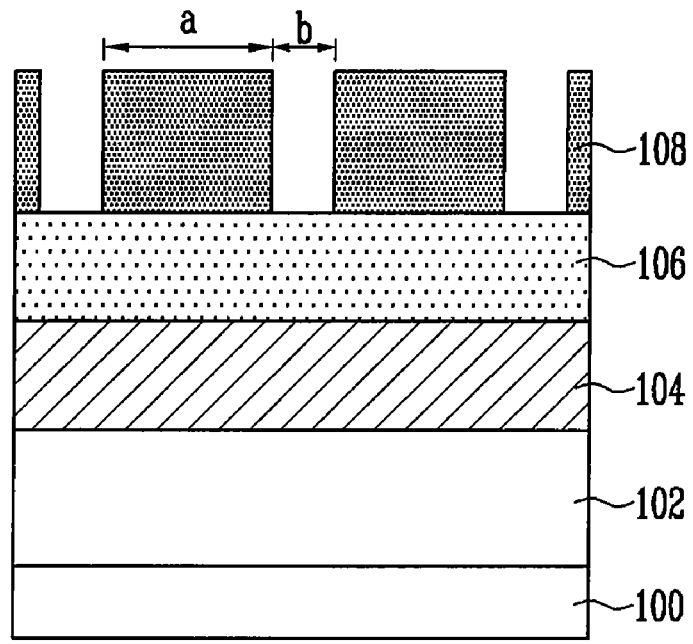
FIGS. 2A to 2J are cross-sectional views illustrating a method of manufacturing a flash memory device according to an embodiment of the present invention.
Figure 2B:
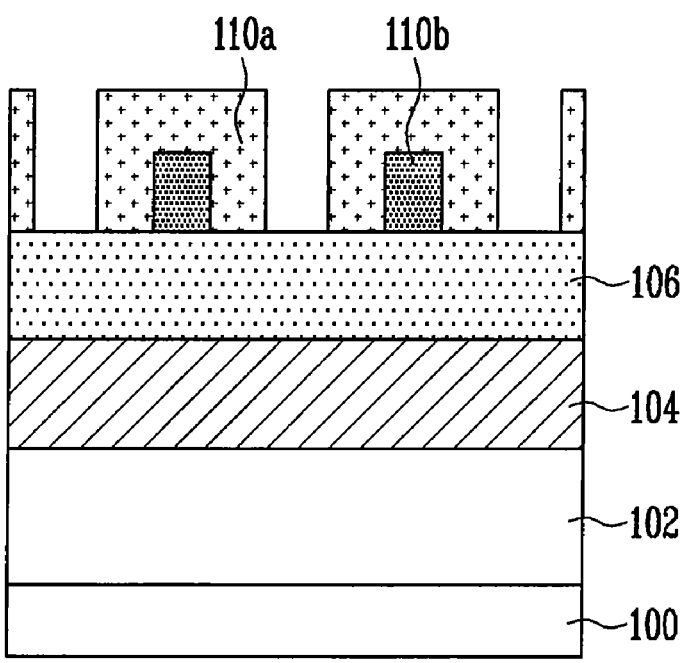

As a result, a silylated photoresist 110a containing silicon and unsilylayed photoresist 110b are formed as shown in FIG. 2B.

Figure 2C:
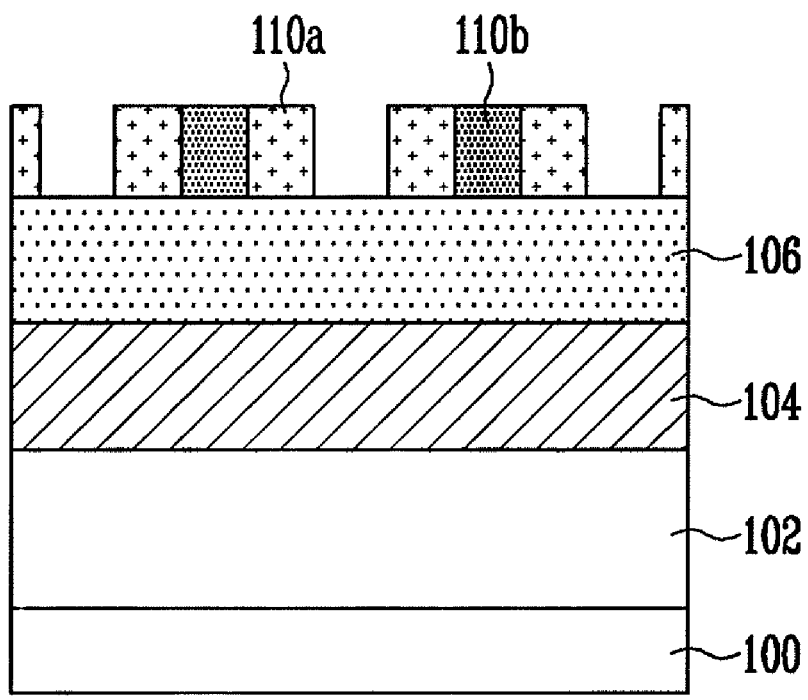
Figure 2D:
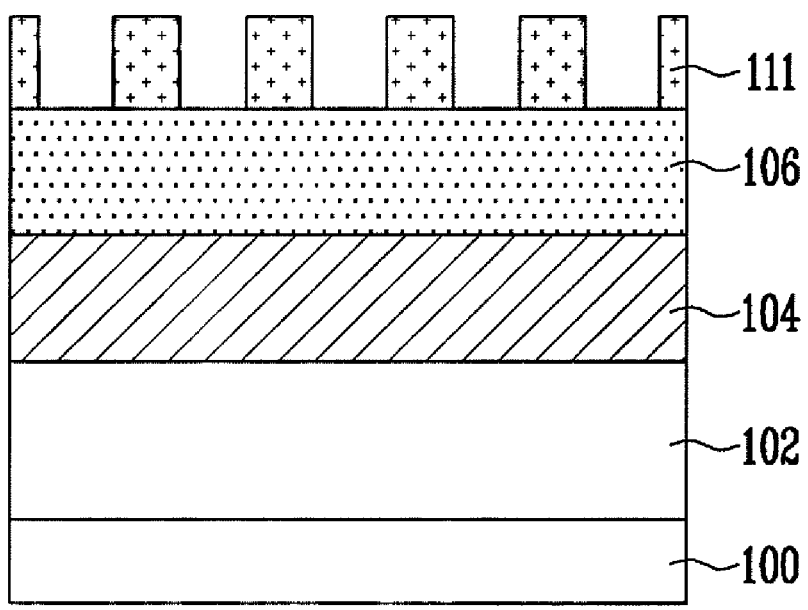

Referring to FIGS. 2C and 2D, the upper region of the silylated photoresist 110a containing silicon is removed by a dry etch process. During this process, the unsilylated photoresist 110b is also removed. Thus, a pattern 111 is formed in the silylated photoresist 110a with a pitch (½P) of that is half that of the first photoresist pattern 108.

Figure 2E:
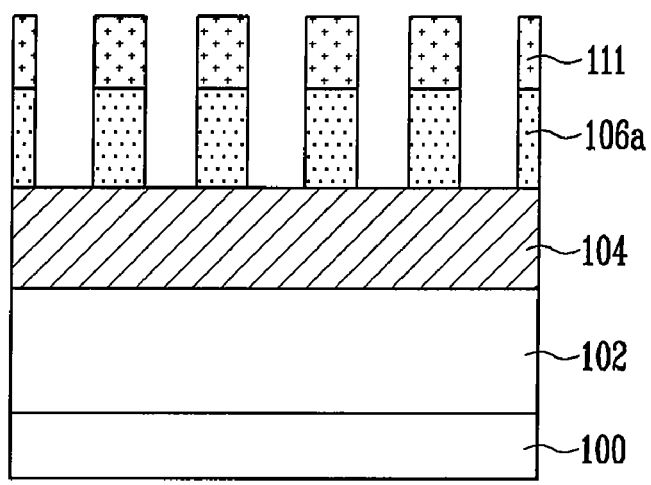

Referring to FIG. 2E, the second hard mask layer 106 is etched by performing an anisotropic etch process using the pattern 111 of the silylated photoresist 110a as a mask. The pattern 111 is then removed. A second hard mask layer pattern 106a having a pitch (½P) is provided. In the present embodiment, the second hard mask layer pattern 106a has a pitch of ½P, but may be another pitch that is less than P.

Figure 1B:
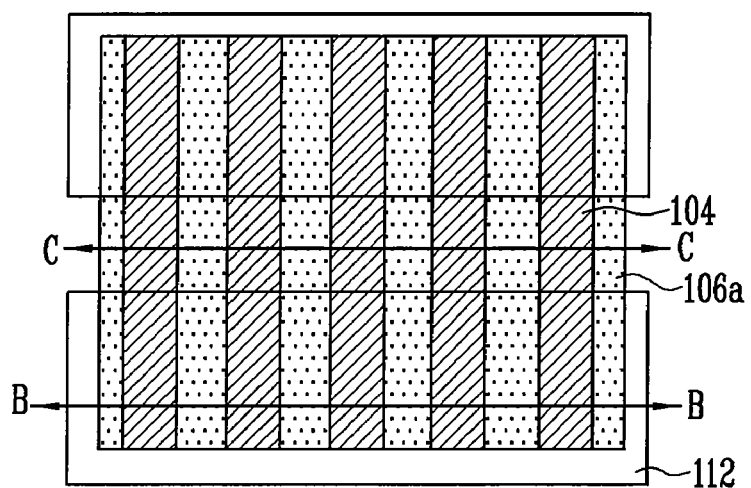
Figure 2F:
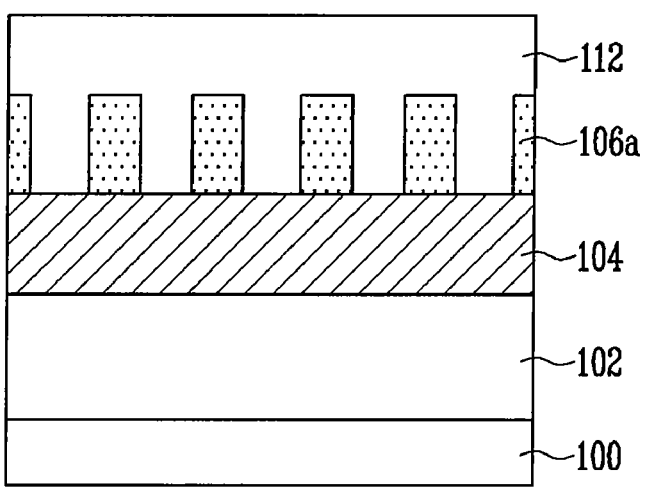
Figure 2G:
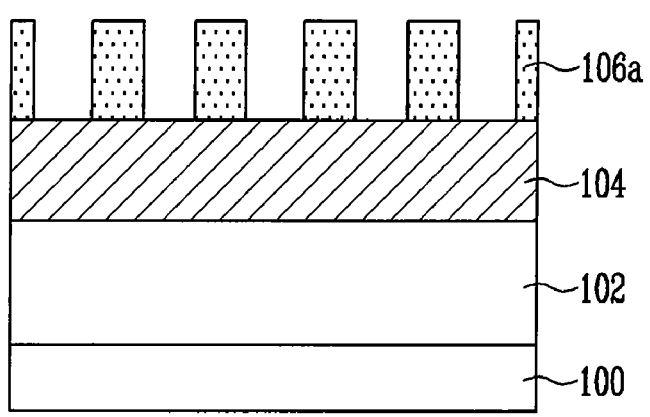

FIG. 2F is a cross-sectional view of the device taken along line B-B in FIG. 1B and FIG. 2G is a cross-sectional view of the device taken along line C-C in FIG. 1B. Referring to FIGS. 1B, 2F and 2G, a second photoresist pattern 112 is formed over substantially the entire surface including the second hard mask layer pattern 106a. The second photoresist pattern 112 defines both an exposure region and a non-exposure region. In the cross section of the device taken along line B-B in FIG. 1B, the region of the second hard mask layer pattern 106a is a non-exposure region (see FIG. 2F). Thus, the second photoresist pattern 112 is coated over and between the second hard mask layer pattern 106a at that region.

On the other hand, in the cross section of the device taken along line C-C in FIG. 1B, the region of the second hard mask layer pattern 106a is an exposure region (see FIG. 2G). Accordingly, the second photoresist pattern 112 is not coated over the second hard mask layer pattern 106a. The second hard mask layer pattern 106a are left open at that region.

Figure 1C:
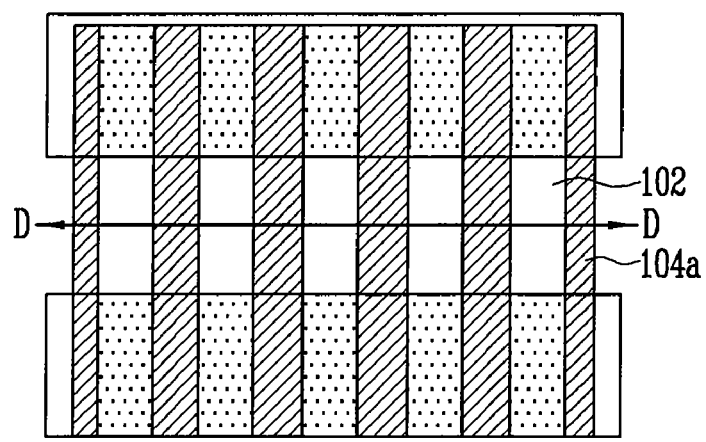
Figure 2H:
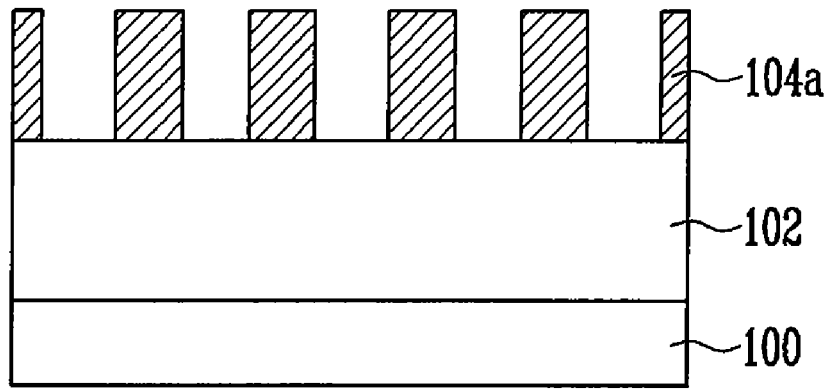

FIG. 2H is a cross-sectional view of the device taken along line D-D in FIG. 1C. Referring to FIGS. 1C and 2H, the first hard mask layer 104 is etched using the second photoresist pattern 112 and the second hard mask layer pattern 106a as masks, forming a first hard mask layer pattern 104a having a rectangular-like shape.

Figure 2I:
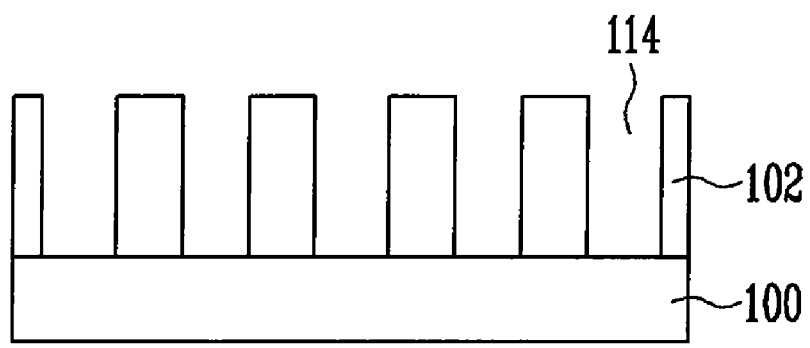

Referring to FIG. 2I, the interlayer insulating layer 102 is etched using the first hard mask layer pattern 104a of the rectangular-like shape as a mask, forming a contact hole 114 through which some regions of the semiconductor substrate 100 are exposed. The contact hole 114 has a rectangular-like shape since it is formed using the first hard mask layer pattern 104a.

Figure 2J:
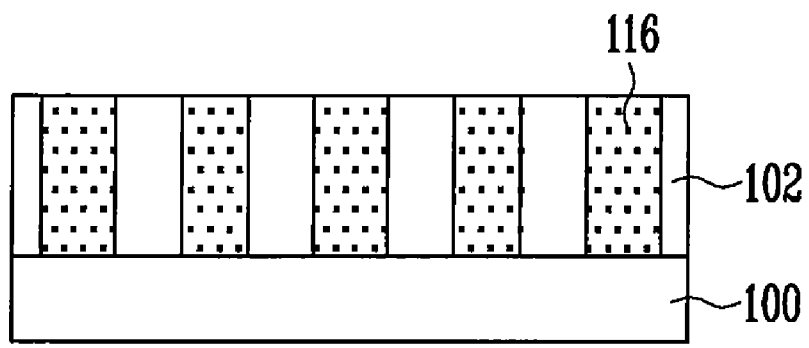

Referring to FIG. 2J, after a polysilicon layer is deposited on the entire surface in such a way to fill the contact hole 114. The polysilicon layer is polished to form a contact plug 116 having a rectangular-like shape.

A method of manufacturing a flash memory device according to another embodiment of the present invention will be described with reference to FIGS. 3A and 3B.

The process steps of forming the drain contact are similar to those of the above embodiment of the present invention. One difference is the process of forming the first photoresist pattern and silylating the formed first photoresist pattern.

Figure 3A:
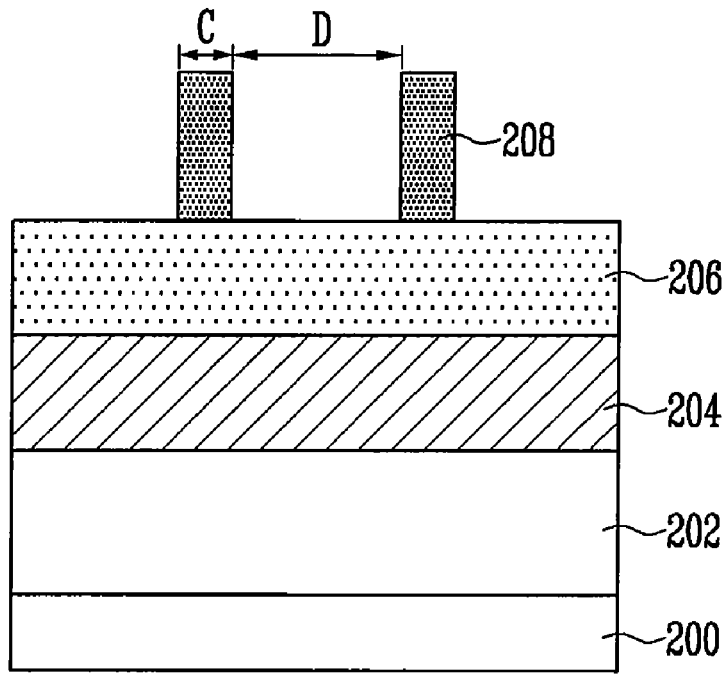
FIGS. 3A and 3B are cross-sectional views illustrating a method of manufacturing a flash memory device according to another embodiment of the present invention.

Referring to FIG. 3A, an interlayer insulating layer 202, a first hard mask layer 204, a second hard mask layer 206 and a first photoresist pattern 208 are sequentially formed on a semiconductor substrate 200 in which given structures are formed. The first photoresist pattern 208 can be formed to have a width C narrower than that of the space D.

Figure 3B:
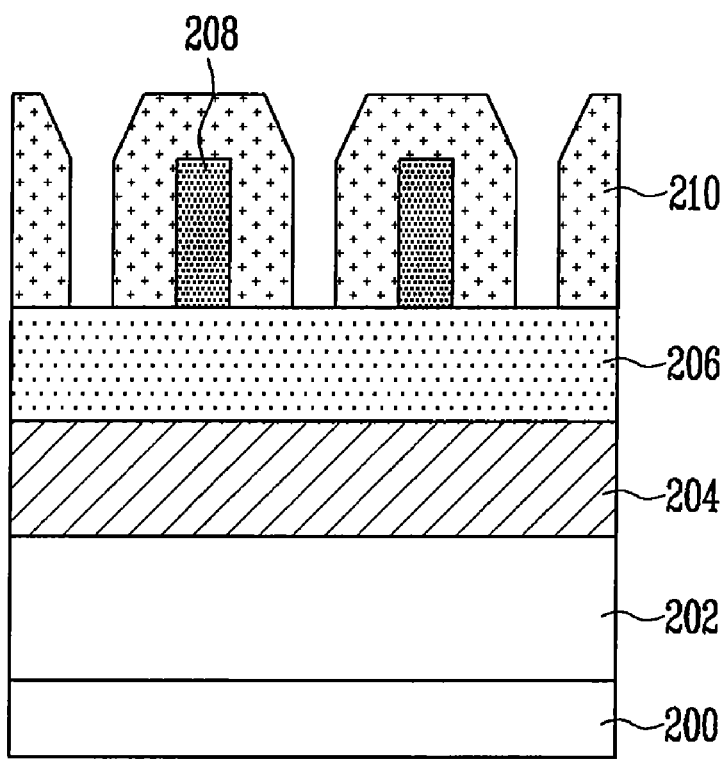

Referring to FIG. 3B, spacer material 210 is formed on the entire surface including the first photoresist pattern 208. The spacer material 210 can be formed from inorganic material or organic material containing silicon. Upper portions of the spacer material 210 are removed to expose the first photoresist pattern 208. The exposed photoresist pattern 208 is removed define a mask pattern that is used to etch the second hard mask layer 206.

Subsequent processes are substantially the same those illustrated in FIGS. 2C to 2J, and the corresponding explanations are omitted, as applicable.

As described above, the present invention has the following characteristics.

First, as the contact plug of a rectangular (or rectangular-like) shape is formed, the electrical characteristics of the contact plug can be improved.

Second, as the contact plug of a rectangular-like shape is formed, the roughness near the edge portion of the contact hole can be controlled, increasing the uniformity between the contact holes.

Third, as the contact plug of a rectangular-like shape is formed, bias control in the long and short axes can be performed easily.

Fourth, the etch process is performed using the first photoresist pattern having a pitch twice that of the contact plug. Accordingly, the same results can be obtained using a design rule where the resolution of exposure equipment are two or more times greater than those in the conventional method.

Although the foregoing description has been made with reference to specific embodiments, it is to be understood that changes and modifications of the present patent may be made by the ordinary skilled in the art without departing from the spirit and scope of the present patent and appended claims.

What is claimed is:

1. A method of manufacturing a flash memory device, the method comprising:
   providing a substrate having an insulating layer, a first mask layer over the insulating layer, a second mask layer over the first mask layer, a first photoresist pattern over the second mask layer, the first photoresist pattern having a first pitch;
   forming a material layer over the first photoresist pattern and the second mask layer, wherein the material layer is formed of inorganic material or of organic material containing silicon;
   removing an upper portion of the material layer to expose the first photoresist pattern to form a material layer pattern having a second pitch that is less than the first pitch;
   removing the exposed first photoresist pattern;
   etching the second hard mask layer using the material layer pattern to form a second hard mask layer pattern that extends along a first direction;
   forming a second photoresist pattern defining a first region that is not exposed and a second region that is exposed, the second region extending along a second direction that is orthogonal to the first direction;

etching the first hard mask layer using the second photoresist pattern to form a first hard mask layer pattern having an angular shape; and etching the insulating layer using the first hard mask layer pattern to form a contact hole having an angular shape that expose material underlying the insulating layer.

2. The method of claim 1, wherein the contact hole has a rectangular-like shape.

3. The method of claim 1, wherein the contact hole has corners that are substantially angular.

4. The method of claim 1, wherein the material exposed by the contact hole is silicon material.

5. The method of claim 1, wherein the material layer is coated over the first photoresist pattern.

* * * * *